United States Patent
Zhang (10) Patent No.: US 11,275,412 B1
(45) Date of Patent: Mar. 15, 2022

(54) DETECTION SYSTEM FOR NON-STANDARD CONNECTION INTERFACE THROUGH ADAPTER CARD

(71) Applicants: Inventec (Pudong) Technology Corporation, Shanghai (CN); Inventec Corporation, Taipei (TW)

(72) Inventor: Lin Zhang, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 17/023,021

(22) Filed: Sep. 16, 2020

(30) Foreign Application Priority Data

Sep. 11, 2020 (CN) .......................... 202010953122.8

(51) Int. Cl.
  *G06F 1/18* (2006.01)
  *H05K 7/14* (2006.01)

(52) U.S. Cl.
  CPC .............. *G06F 1/185* (2013.01); *G06F 1/186* (2013.01); *H05K 7/1405* (2013.01)

(58) Field of Classification Search
  CPC ......... G06F 1/185; G06F 1/186; H05K 1/141; H05K 7/1405; H05K 1/144; H05K 2203/162; G01R 31/66
  See application file for complete search history.

(56) References Cited

U.S. PATENT DOCUMENTS

| | | | | |
|---|---|---|---|---|
| 6,491,528 B1 * | 12/2002 | McLean | ................. | H05K 7/142 361/760 |
| 8,203,354 B2 * | 6/2012 | Roderick | ............. | H05K 1/0268 324/756.02 |
| 8,379,403 B2 * | 2/2013 | Waite | ................. | G01R 1/06772 361/777 |

* cited by examiner

*Primary Examiner* — James Wu
(74) *Attorney, Agent, or Firm* — David R. Stevens; Stevens Law Group (57) ABSTRACT

A detection system for non-standard connection interface through an adapter card. In the detection system, snaps of a first assembly are inserted through fastening slots of an adapter card, to make the first assembly and the adapter card fasten and engage with each other; the snaps of the first assembly are further inserted through engaging slots of a second assembly, to make the first assembly, the adapter card and the second assembly engage and fasten with each other; a motherboard is electrically connected to the adapter card, and the adapter card is electrically connected to a standard test adapter card, and the standard test adapter card is electrically connected to a standard BSI development test fixture, thereby achieving the technical effect of restraining protection for the adapter card and improvement of stability in detection for the non-standard connection interface.

10 Claims, 8 Drawing Sheets

DETECTION SYSTEM FOR NON-STANDARD CONNECTION INTERFACE THROUGH ADAPTER CARD

CROSS-REFERENCE TO RELATED APPLICATION

This application claims the benefit of Chinese Application Serial No. 202010953122.8, filed Sep. 11, 2020, which is hereby incorporated herein by reference in its entirety.

BACKGROUND OF THE INVENTION

1. Field of the Invention

The present invention relates to a detection system, and more particularly to a detection system for non-standard connection interface through an adapter card.

2. Description of the Related Art

In the conventional motherboard test for a non-standard connection interface, a specific connection line corresponding to the non-standard connection interface is required to connect the non-standard connection interface to an adapter card of a standard BSI (Boundary Scan Inspection) development test fixture, so that the test can be performed on the non-standard connection interface through the standard BSI development test fixture.

In the above test conditions, it is necessary to customize specific connection lines for different non-standard connection interfaces; however, the non-standard connection interfaces are only used in specific order cases, so the customizations of the specific connection lines may cause high cost and be limited by patent rights of the non-standard connection interfaces. Therefore, it inconvenient to produce specific connection lines.

Furthermore, the specific connection line and the non-standard connection interface generally are electrically connected by metal engaging structures, and the repeated connection and removal operations during the test process may easily damage metal engaging structures of the non-standard connection interface and the specific connection line, to cause incorrect test results for non-standard connection interfaces.

Therefore, what is needed is to develop an improved technical solution to solve the conventional problem that the detection for the non-standard connection interface of the motherboard is inconvenient and the accuracy of the detection result is not good enough.

SUMMARY OF THE INVENTION

In order to solve the conventional technical problems that the detection for a non-standard connection interface of a motherboard is inconvenient and the accuracy of the detection result is not good enough, the present invention provides a detection system for non-standard connection interface through an adapter card.

The present invention provides a detection system for non-standard connection interface including a motherboard and an adapter card, a first assembly, a second assembly, a standard test adapter card, and a standard BSI development test fixture; the adapter card includes a non-standard connection interface, a first standard connection interface, and a plurality of fastening slots; the standard test adapter card includes a plurality of second standard connection interfaces and a plurality of first standard BSI development test fixture connection interfaces.

The motherboard includes a plurality of motherboard non-standard connection interfaces, and type ratios of circuits connected to the plurality of motherboard non-standard connection interfaces are different;

The non-standard connection interface of the adapter card is configured to electrically connect to one of the plurality of motherboard non-standard connection interfaces. The first standard connection interface of the adapter card is electrically connected to the non-standard connection interface. The plurality of fastening slots of the adapter card is disposed on the adapter card.

The first assembly includes a plurality of snaps corresponding in position to the plurality of fastening slots of the adapter card one by one, and the snaps of the first assembly are configured to insert through the fastening slots of the adapter card to make the first assembly and the adapter card fasten and engage with each other.

The second assembly includes a plurality of engaging slots and a standard connection interface through slot. The first assembly is engaged and fastened with the adapter card, the plurality of snaps of the first assembly are then inserted through the plurality of engaging slots of the second assembly, respectively, and the first standard connection interface is inserted through the standard connection interface through slot, to make the first assembly, the adapter card and the second assembly engage and fasten with each other.

Each of the plurality of second standard connection interfaces of the standard test adapter card has the different number of pins, and one of the second standard connection interfaces is selected to electrically connect to the first standard connection interface according to the number of pins of each of the plurality of second standard connection interfaces and the type ratio of the circuits connected to each of the plurality of motherboard non-standard connection interfaces. The plurality of first standard BSI development test fixture connection interfaces of the standard test adapter card are electrically connected to the plurality of second standard connection interfaces.

The standard BSI development test fixture includes a second standard BSI development test fixture connection interface configured to electrically connect to the plurality of first standard BSI development test fixture connection interfaces. The standard BSI development test fixture is electrically connected to the plurality of first standard BSI development test fixture connection interfaces through the second standard BSI development test fixture connection interface and performs test on the connected one of the motherboard non-standard connection interfaces of the motherboard.

According to the above-mentioned content, the difference between the present invention and conventional technology is that the snaps of the first assembly can be inserted through the fastening slots of the adapter card to make the first assembly and the adapter card fasten and engage with each other, and the snaps of the first assembly are further inserted through the engaging slots of the second assembly to make the first assembly, the adapter card and the second assembly engage and fasten with each other; the motherboard is electrically connected to the adapter card, the adapter card is electrically connected to the standard test adapter card, and the standard test adapter card is electrically connected to the standard BSI development test fixture, so as to provide restraining protection for the adapter card and improvement of stability in detection for the non-standard connection interface.

Therefore, the technical solution of the present invention can provide restraining protection for the adapter card and improvement of stability in detection for the non-standard connection interface.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

The detection system for non-standard connection interface of the present invention will be described in following paragraphs. Please refer to FIG. 1, which is a system block diagram of a detection system for non-standard connection interface through an adapter card, according to the present invention.

Figure 1:
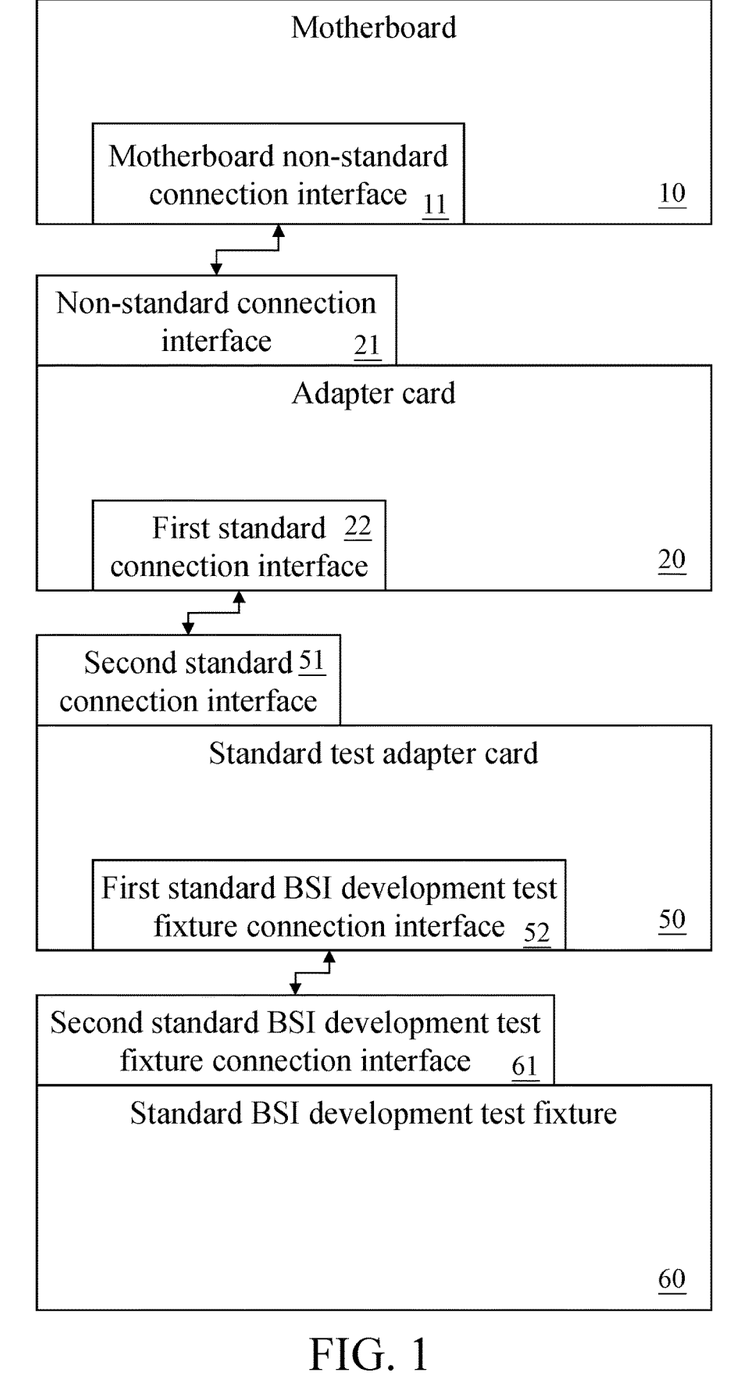
FIG. 1 is a system block diagram of a detection system for non-standard connection interface through an adapter card, according to the present invention.

As shown in FIG. 1, the detection system of the present invention includes a motherboard 10, an adapter card 20, a first assembly 30, a second assembly 40, a standard test adapter card 50, and a standard BSI development test fixture 60; the adapter card 20 includes a non-standard connection interface 21, a first standard connection interface 22, and a plurality of fastening slots 23; the standard test adapter card 50 includes a plurality of second standard connection interfaces 51 and a first standard BSI development test fixture connection interface 52.

The motherboard 10 includes a plurality of motherboard non-standard connection interfaces 11; for example, the motherboard non-standard connection interface 11 is the interface which is not the well-known standard interface such as universal serial bus (USB), peripheral component Interconnect express (PCI-E), serial advanced technology attachment (SATA), dual in-line memory module (DIMM) and so on; however, these examples are merely for exemplary illustration, and the application field of the present invention is not limited to these examples.

The type ratio of the circuits connected to each of the motherboard non-standard connection interfaces 11 of the motherboard 10 is not the same; particularly, each of the motherboard non-standard connection interface 11 of the motherboard 10 can be connected to at least one of the circuit including, for example, a pull-up resistor, a pull-down resistor, a rectifier circuit, a unidirectional/bi-directional control circuit, a switch circuit, a regulator and so on; however, these examples are merely for exemplary illustration, and the application field of the present invention is not limited to these examples.

Figure 2:
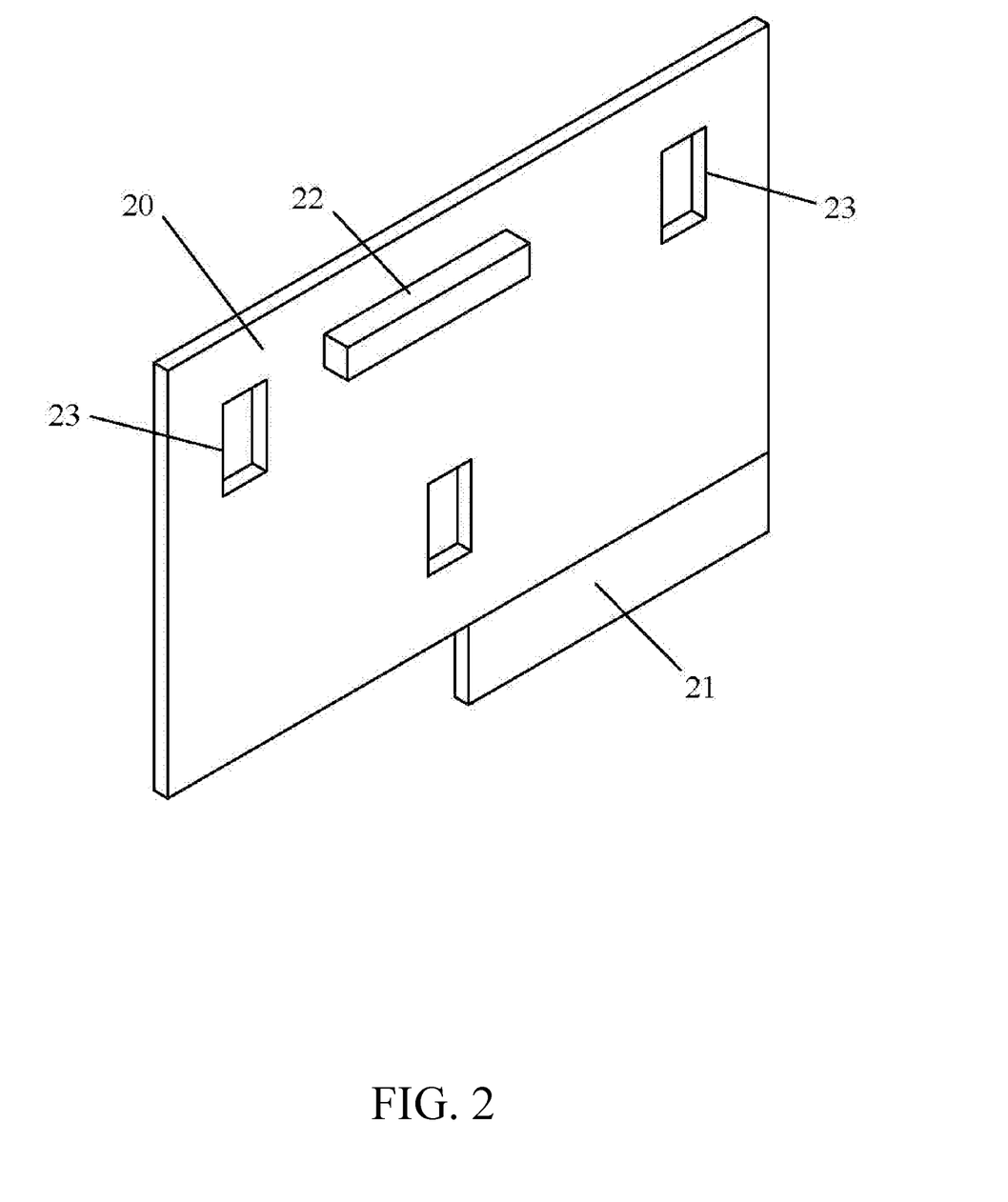
FIG. 2 is a perspective view an adapter card for detection of a non-standard connection interface, according to the present invention.

The adapter card 20 includes a non-standard connection interface 21 and a first standard connection interface 22, the non-standard connection interface 21 of the adapter card 20 is configured to electrically connect to one of the motherboard non-standard connection interfaces 11 of the motherboard 10, the first standard connection interface 22 of the adapter card 20 is electrically connected to the non-standard connection interface 21 of the adapter card 20; the plurality of fastening slots 23 are disposed on the adapter card 20. Please refer to FIG. 2, which shows a schematic view of the adapter card 20 for detection of a non-standard connection interface, according to the present invention. The adapter card 20 is configured to transfer the selected one of the motherboard non-standard connection interfaces of the motherboard 10 11 from a non-standard connection interface into a standard connection interface.

Figure 3:
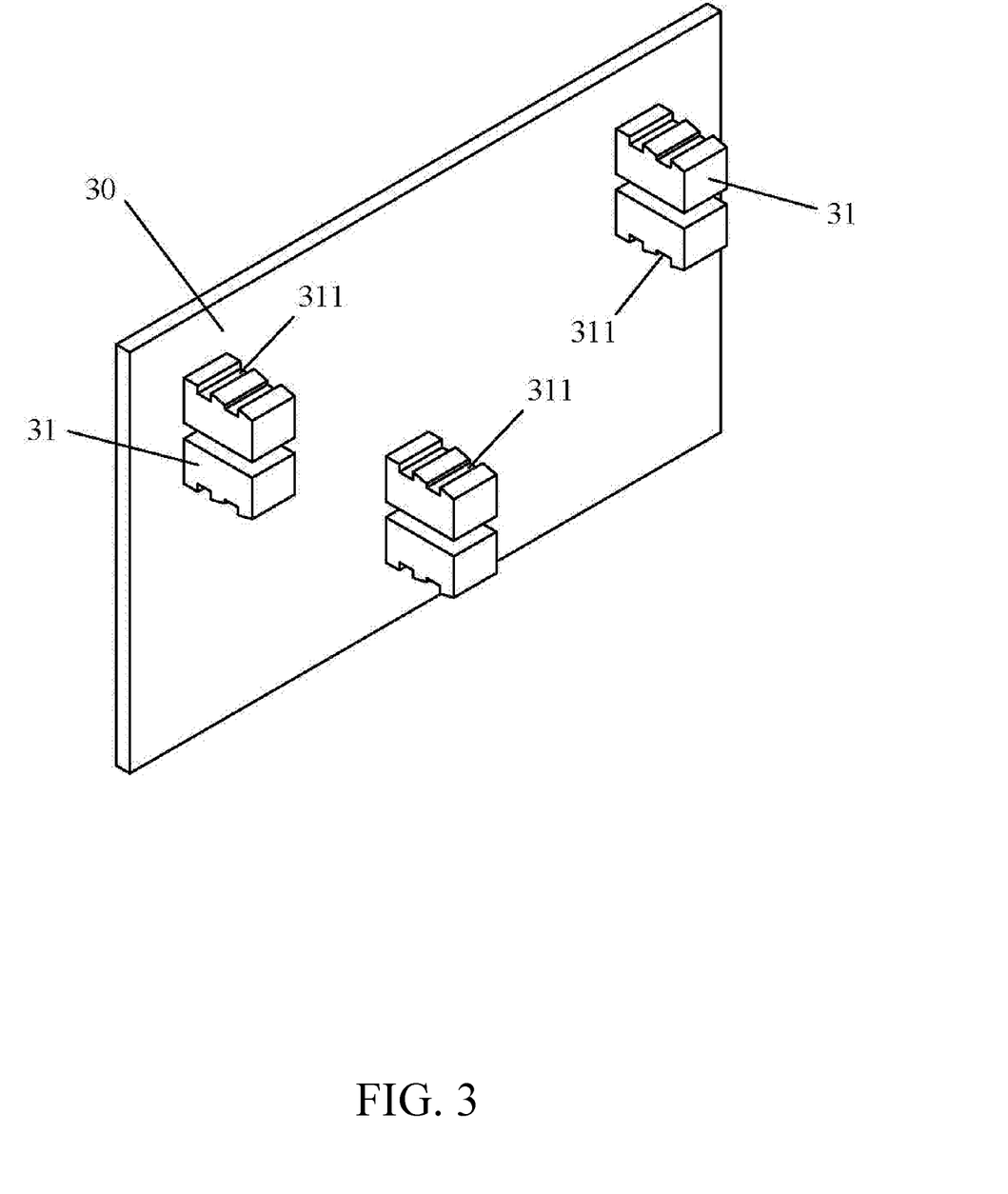
FIG. 3 is a perspective view a first assembly for detection of a non-standard connection interface, according to the present invention.

Please refer to FIG. 3, which is a perspective view a first assembly for detection of a non-standard connection interface, according to the present invention. The first assembly 30 includes a plurality of snaps 31 corresponding in position to the plurality of fastening slots 23 of the adapter card 20 one by one. The plurality of snaps 31 of the first assembly 30 are inserted through the plurality of fastening slots 23 of the adapter card 20 to make the first assembly 30 and the adapter card 20 fasten and engage with each other. Please refer to FIG. 4, which shows a perspective assembled view of the first assembly 30 and the adapter card 20 engaged and fastened with each other, for detection of a non-standard connection interface, according to the present invention.

Figure 4:
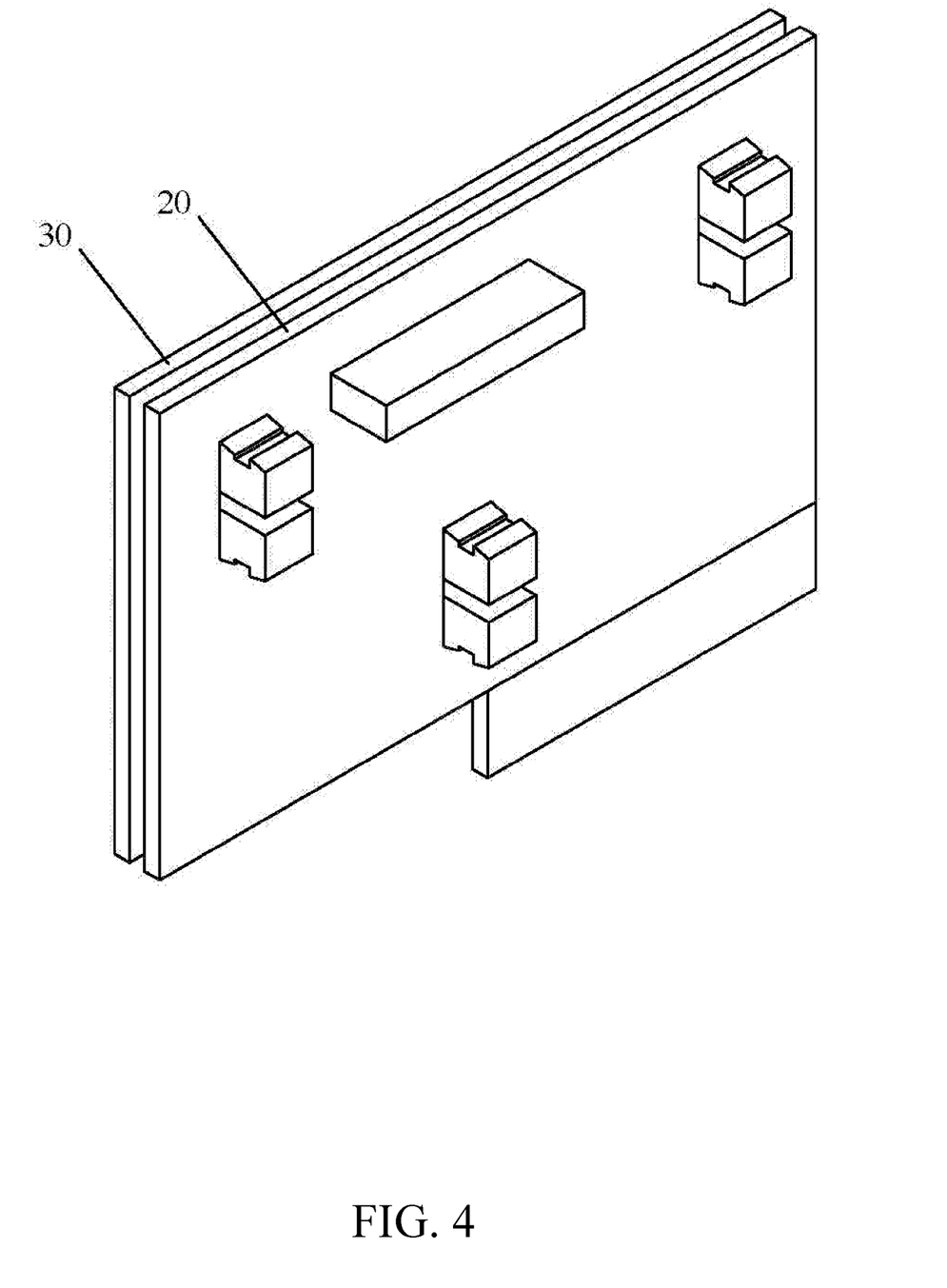
FIG. 4 is a perspective assembled view of a first assembly and an adapter card for detection of a non-standard connection interface, according to the present invention.

It should be noted that, the first assembly 30 can be made by polymer material, such as: epoxy resin, polyethylene, PVC and so on; however, these examples are merely for exemplary illustration, and the application field of the present invention is not limited to these examples. The snaps 31 of the first assembly 30 can be pressed to insert through the fastening slots 2 of the adapter card 20, to make the first assembly 30 and the adapter card 20 engage and fasten with each other by restored elasticity of the snaps 31 of the first assembly 30 and fastening grooves 311 of the snaps 31.

Figure 5:
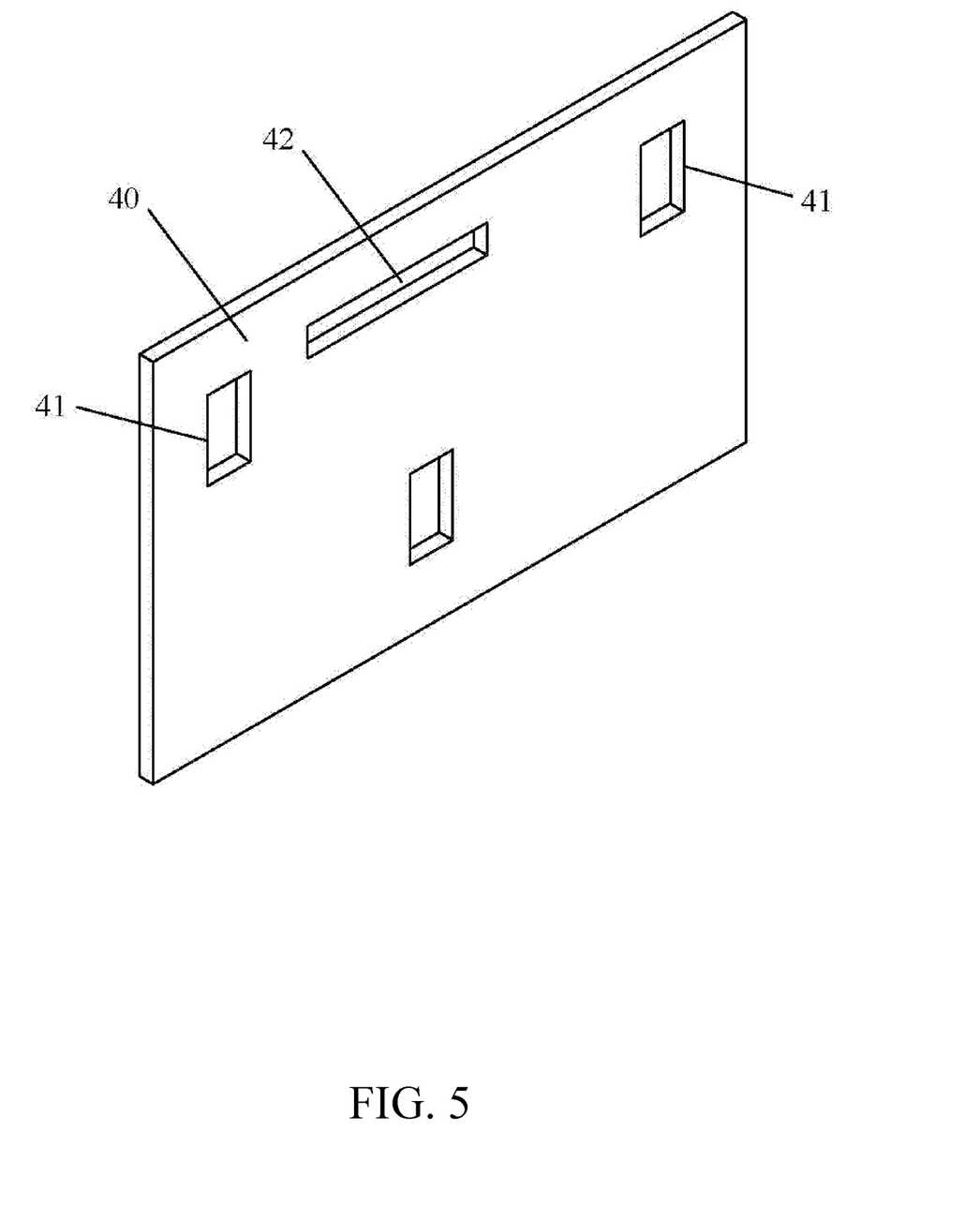
FIG. 5 is a perspective view of a second assembly for detection of a non-standard connection interface, according to the present invention.
Figure 6:
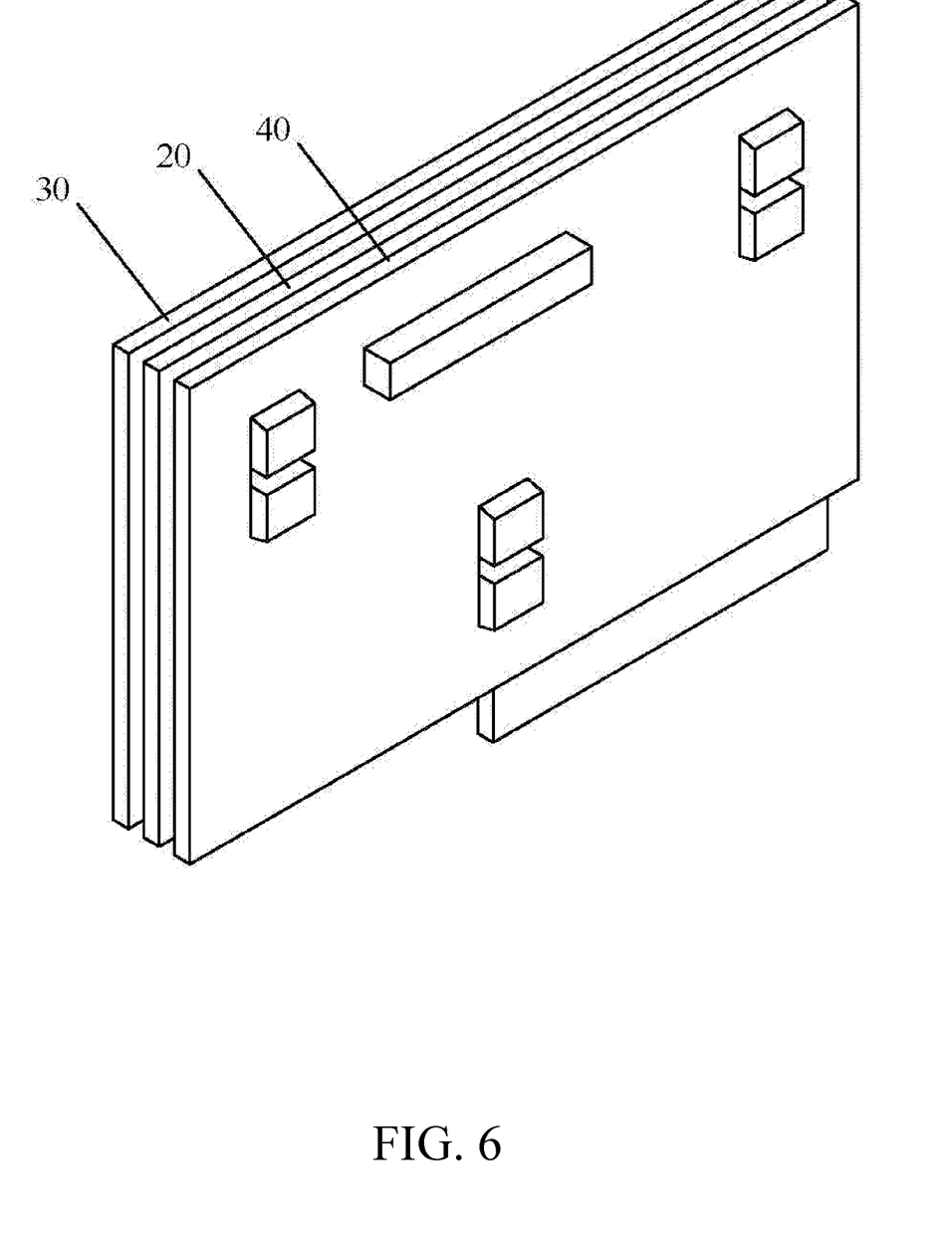
FIG. 6 is a perspective assembled view of a first assembly, an adapter card and a second assembly for detection of a non-standard connection interface, according to the present invention.

Please refer to FIG. 5, which is a perspective view a second assembly for detection of a non-standard connection interface, according to the present invention. The second assembly 40 includes a plurality of engaging slots 41 and a standard connection interface through slot 42. After the first assembly 30 and the adapter card 20 are engaged and fastened with each other, the plurality of snaps 31 of the first assembly 30 can be further inserted through the plurality of engaging slots 41 of the second assembly 40, and the first standard connection interface 22 of the adapter card 20 can also be inserted through the standard connection interface through slot 42 of the second assembly 40, to make the first assembly 30, the adapter card 20 and the second assembly 40 engage and fasten with each other, as shown in FIG. 6, which shows a perspective assembled view of the first assembly 30, the adapter card 20 and the second assembly 40 for detection of a non-standard connection interface, according to the present invention.

It should be noted that, the second assembly 40 can also be made by polymer material, polymer material such as: epoxy resin, polyethylene, PVC and so on; however, these examples are merely for exemplary illustration, and the application field of the present invention is not limited to these examples. The snaps 31 of the first assembly 30 can be inserted through the engaging slots 41 of the second assembly 40 to make the first assembly 30, the adapter card 20 and the second assembly 40 engage and fasten with each other by the restored elasticity of the snaps 31 of the first assembly 30 and the fastening grooves 311 of the snaps 31.

Figure 7:
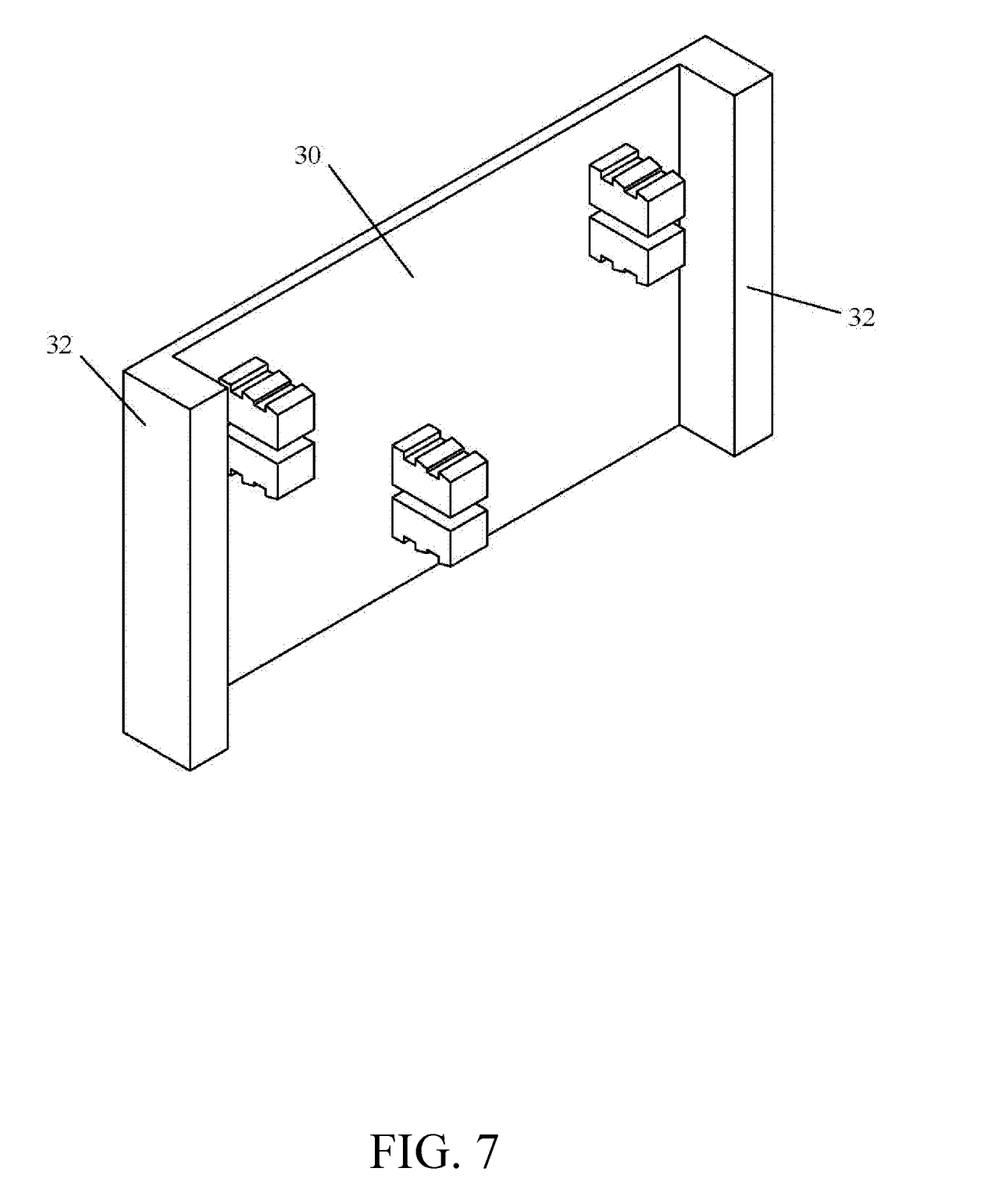
FIG. 7 is a perspective view of a first assembly for detection of a non-standard connection interface, according to the present invention.

The first assembly 30 can include a set of guide-and-protection members 32, the guide-and-protection members 32 of the first assembly 30 are disposed on two ends of the first assembly 30 and configured to guide and protect the first assembly 30 and the adapter card 20 when the first assembly 30 is engaged and fastened with the adapter card 20; furthermore, the guide-and-protection member 32 of the first assembly 30 can guide and protect the second assembly 40 when the first assembly 30, the adapter card 20 and the second assembly 40 are engaged and fastened with each other, as shown in FIG. 7, which shows a perspective assembled view of the first assembly 30 for detection of a non-standard connection interface, according to the present invention.

Figure 8:
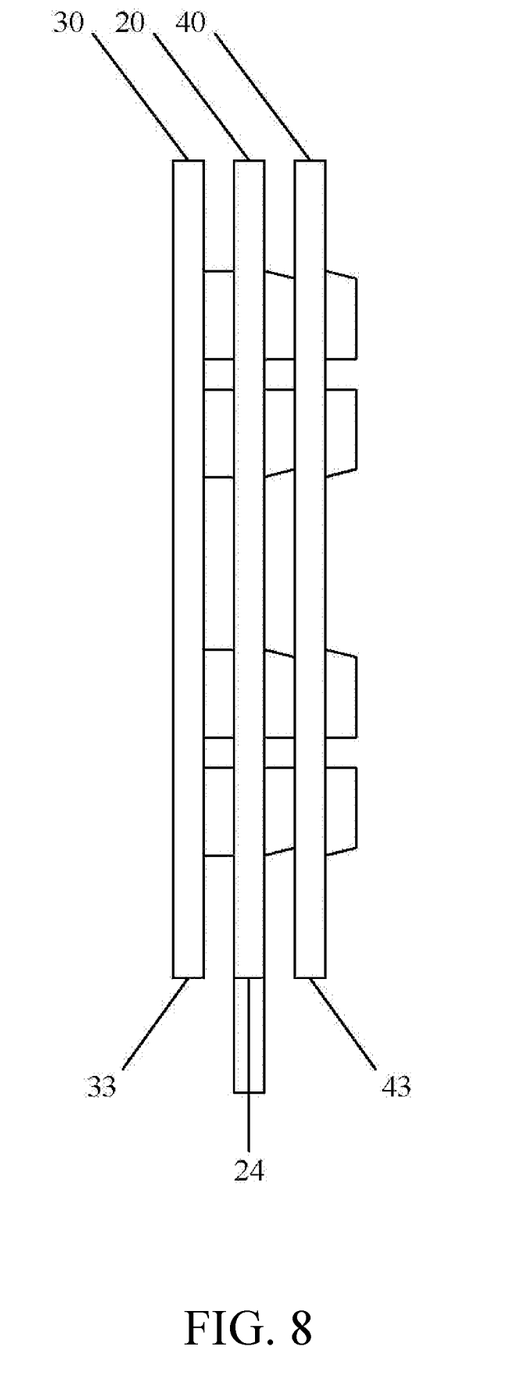
FIG. 8 is a plane assembled view of a first assembly, an adapter card and a second assembly for detection of a non-standard connection interface, according to the present invention.

Please refer to FIG. 8, which is a plane assembled view of a first assembly, an adapter card and a second assembly for detection of a non-standard connection interface, according to the present invention. As shown in FIG. 8, a bottom side 33 of the first assembly 30, a bottom side 43 of the second assembly 40 and a bottom side 24 of the adapter card 20 are aligned to each other; when the non-standard connection interface 21 of the adapter card 20 is electrically connected to one of the motherboard non-standard connection interfaces 11 of the motherboard 10, the first assembly 30 and the second assembly 40 can be used to restrain the adapter card 20, that is, during the mechanically assembling process, the non-standard connection interface 21 of the adapter card 20 is connected and assembled with one of the motherboard non-standard connection interfaces 11 of the motherboard 10, and during the process of assembling the non-standard connection interface 21 of the adapter card 20 with one of the motherboard non-standard connection interfaces 11 of the motherboard 10, the first assembly 30 and the second assembly 40 can be used to restrain the adapter card 20 to prevent the non-standard connection interface 21 of the adapter card 20 and the connected one pf the motherboard non-standard connection interfaces 11 of the motherboard 10 from being damaged during the mechanically assembling process.

Each of the second standard connection interface 51 of the standard test adapter card 50 has the different number of pins, and one of the second standard connection interfaces 51 of the standard test adapter card 50 is selected to electrically connect the first standard connection interface 22 of the adapter card 20 according to the number of pins of each of the second standard connection interfaces 51 of the standard test adapter card 50 and the type ratio of the circuits connected to each of the motherboard non-standard connection interfaces 11 of the motherboard 10. The first standard BSI development test fixture connection interfaces 52 of the standard test adapter card 50 are electrically connected to the second standard connection interface 51 of the standard test adapter card 50.

It should be noted that, in an embodiment, each of the first standard BSI development test fixture connection interfaces 52 of the standard test adapter card 50 can be electrically connected to each of the plurality of second standard connection interfaces 51 of the standard test adapter card 50; in another embodiment, each of the first standard BSI development test fixture connection interfaces 52 of the standard test adapter card 50 can be electrically connected respective different one of the second standard connection interfaces 51 of the standard test adapter card 50 only; in another embodiment, each of the first standard BSI development test fixture connection interfaces 52 of the standard test adapter card 50 is electrically connected to a part of the second standard connection interfaces 51 of the standard test adapter card 50.

Particularly, in an embodiment, the standard test adapter card 50 includes a first first standard BSI development test fixture connection interface 52 and a second first standard BSI development test fixture connection interface 52, a first second standard connection interface 51, a second second standard connection interface 51, and a third second standard connection interface 51; the first first standard BSI development test fixture connection interface 52 is electrically connected to the first second standard connection interface 51, the second second standard connection interface 51 and the third second standard connection interface

51, and the second first standard BSI development test fixture connection interface 52 is also electrically connected to the first second standard connection interface 51, the second second standard connection interface 51 and the third second standard connection interface 51.

Particularly, in another embodiment, the standard test adapter card 50 includes a first first standard BSI development test fixture connection interface 52 and a second first standard BSI development test fixture connection interface 52, a first second standard connection interface 51, a second second standard connection interface 51, and a third second standard connection interface 51; the first first standard BSI development test fixture connection interface 52 is electrically connected to the first second standard connection interface 51 only, and the second first standard BSI development test fixture connection interface 52 is electrically connected to the second second standard connection interface 51 and the third second standard connection interface 51 only.

Particularly, in another embodiment, the standard test adapter card 50 includes a first first standard BSI development test fixture connection interface 52 and a second first standard BSI development test fixture connection interface 52, a first second standard connection interface 51, a second second standard connection interface 51, and a third second standard connection interface 51; the first first standard BSI development test fixture connection interface 52 is electrically connected to the first second standard connection interface 51 and the second second standard connection interface 51, and the second first standard BSI development test fixture connection interface 52 is electrically connected to the second second standard connection interface 51 and the third second standard connection interface 51.

The standard BSI development test fixture 60 includes a second standard BSI development test fixture connection interface 61 configured to electrically connect to the first standard BSI development test fixture connection interface 52 of the standard test adapter card 50, so that the standard BSI development test fixture 60 is electrically connected to the standard test adapter card 50, the motherboard 10 is electrically connected to the adapter card 20, the adapter card 20 is electrically connected to the standard test adapter card 50, the standard test adapter card 50 is electrically connected to the standard BSI development test fixture 60, and the standard BSI development test fixture 60 can perform a test on the connected one of the plurality of motherboard non-standard connection interfaces 11 of the motherboard 10.

According to the above-mentioned contents, the difference between the present invention and the conventional technology is that, in the present invention, the snaps of the first assembly can be inserted through the fastening slots of the adapter card to make the first assembly and the adapter card fasten and engage with each other, and the snaps of the first assembly can further be inserted through the engaging slots of the second assembly to make the first assembly, the adapter card and the second assembly engage and fasten with each other, and the motherboard can be electrically connected to the adapter card, the adapter card can be electrically connected to the standard test adapter card, the standard test adapter card can be electrically connected to the standard BSI development test fixture, so as to provide restraining protection for the adapter card and improve stability in detection for the non-standard connection interface.

Therefore, the technical solution of the present invention can solve the conventional technical problems that the conventional detection for the non-standard connection interface of the motherboard is inconvenient and accuracy of the detection result is not good enough, so as to achieve the technical effect of providing the restraining protection for the adapter card and improvement of stability in detection for the non-standard connection interface.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A detection system for non-standard connection interface, comprising:
    a motherboard comprising a plurality of motherboard non-standard connection interfaces, wherein type ratios of circuits connected to the plurality of motherboard non-standard connection interfaces are different;
    an adapter card comprising:
        a non-standard connection interface is configured to electrically connect to one of the plurality of motherboard non-standard connection interfaces;
        a first standard connection interface electrically connected to the non-standard connection interface; and
        a plurality of fastening slots disposed on the adapter card;
    a first assembly comprising a plurality of snaps corresponding in position to the plurality of fastening slots of the adapter card one by one, wherein the snaps of the first assembly are configured to insert through the fastening slots of the adapter card to make the first assembly and the adapter card fasten and engage with each other;
    a second assembly comprising a plurality of engaging slots and a standard connection interface through slot, wherein the first assembly is engaged and fastened with the adapter card, the plurality of snaps of the first assembly are then inserted through the plurality of engaging slots of the second assembly, respectively, and the first standard connection interface is inserted through the standard connection interface through slot, to make the first assembly, the adapter card and the second assembly engage and fasten with each other;
    a standard test adapter card comprising:
        a plurality of second standard connection interfaces, wherein each of the plurality of second standard connection interfaces has different number of pins, and one of the second standard connection interfaces is selected to electrically connect to the first standard connection interface according to the number of pins of each of the plurality of second standard connection interfaces and the type ratio of the circuits connected to each of the plurality of motherboard non-standard connection interfaces; and
        a plurality of first standard BSI (Boundary Scan Inspection) development test fixture connection interfaces electrically connected to the plurality of second standard connection interfaces; and
    a standard BSI development test fixture comprising a second standard BSI development test fixture connection interface configured to electrically connect to the plurality of first standard BSI development test fixture connection interfaces, wherein the standard BSI development test fixture is electrically connected to the plurality of first standard BSI development test fixture connection interfaces through the second standard BSI development test fixture connection interface and performs test on the connected one of the motherboard non-standard connection interfaces of the motherboard.

2. The detection system according to claim 1, wherein each of the type ratios of the circuits is selected from the group consisting of a pull-up resistor, a pull-down resistor, a rectifier circuit, a unidirectional or bi-directional control circuit, a switch circuit and a regulator.

3. The detection system according to claim 1, wherein the first assembly is made by polymer material.

4. The detection system according to claim 1, wherein the plurality of snaps of the first assembly are configured to be pressed to insert through the plurality of fastening slots of the adapter card, to make the first assembly and the adapter card fasten and engage with each other by restored elasticity of the plurality of snaps of the first assembly and a plurality of fastening grooves of the plurality of snaps.

5. The detection system according to claim 1, wherein the second assembly is made by polymer material.

6. The detection system according to claim 1, wherein the plurality of snaps of the first assembly are inwardly pressed to insert through the plurality of engaging slots of the second assembly, to make the adapter card and the second assembly engage and fasten with each other by restored elasticity of the plurality of snaps of the first assembly and a plurality of fastening grooves of the plurality of engaging slots.

7. The detection system according to claim 1, wherein the first assembly comprises a set of guide-and-protection members configured to guide and protect the first assembly and the adapter card which are engaged and fastened with each other.

8. The detection system according to claim 1, wherein the first assembly comprises a set of guide-and-protection member configured to guide and protect the first assembly, the adapter card and the second assembly which are engaged and fastened with each other.

9. The detection system according to claim 1, wherein a bottom side of the first assembly, a bottom side of the second assembly and a bottom side of the adapter card are aligned to each other, so as to make the first assembly and the second assembly restrain the adapter card.

10. The detection system according to claim 1, wherein connections between the plurality of first standard BSI development test fixture connection interfaces and the plurality of second standard connection interfaces satisfy one of following configurations:
  the plurality of first standard BSI development test fixture connection interfaces are electrically connected to the plurality of second standard connection interfaces, respectively;
  each of the plurality of first standard BSI development test fixture connection interfaces is electrically connected to respective different one of the plurality of second standard connection interfaces; and
  each of the plurality of first standard BSI development test fixture connection interfaces is electrically connected to a part of the plurality of second standard connection interfaces.

* * * * *